(12) United States Patent
Wu et al.

(10) Patent No.: US 12,484,278 B2
(45) Date of Patent: Nov. 25, 2025

(54) SEMICONDUCTOR STRUCTURE AND ASSOCIATED FABRICATING METHOD

(71) Applicant: Taiwan Semiconductor Manufacturing Company Ltd., Hsinchu (TW)

(72) Inventors: Hong-Shyang Wu, Taipei (TW); Kuo-Ming Wu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/521,459

(22) Filed: Nov. 28, 2023

(65) Prior Publication Data

US 2024/0096975 A1 Mar. 21, 2024

Related U.S. Application Data

(60) Continuation of application No. 17/301,219, filed on Mar. 29, 2021, now Pat. No. 11,855,158, which is a (Continued)

(51) Int. Cl.
*H10D 30/60* (2025.01)
*H10D 30/01* (2025.01)
(Continued)

(52) U.S. Cl.
CPC ....... *H10D 64/118* (2025.01); *H10D 30/0212* (2025.01); *H10D 30/0221* (2025.01); *H10D 30/0281* (2025.01); *H10D 30/603* (2025.01); *H10D 30/65* (2025.01); *H10D 64/111* (2025.01); *H10D 62/307* (2025.01)

(58) Field of Classification Search
CPC ... H10D 64/118; H10D 62/307; H10D 62/116
See application file for complete search history.

(56) References Cited

U.S. PATENT DOCUMENTS

| 5,440,163 A | 8/1995 | Ohhashi |
| 7,678,690 B2 | 3/2010 | Richter |

(Continued)

FOREIGN PATENT DOCUMENTS

| CN | 101740577 A | 6/2010 |
| CN | 103996680 A | 8/2014 |

(Continued)

*Primary Examiner* — Suberr L Chi
(74) *Attorney, Agent, or Firm* — Haynes and Boone, LLP

(57) ABSTRACT

A semiconductor structure is disclosed. The semiconductor structure includes: a substrate; a gate structure formed on the substrate; a source region and a drain region formed in the substrate on either side of the gate structure, the source region and the drain region both having a first type of conductivity; and a dielectric layer having a first portion and a second portion, wherein the first portion of the dielectric layer is formed on a portion of the gate structure, and the second portion of the dielectric layer is formed on the substrate and extending to a portion of the drain region, wherein the dielectric layer includes at least one recess on the second portion. An associated fabricating method is also disclosed.

20 Claims, 11 Drawing Sheets

Related U.S. Application Data continuation of application No. 16/046,354, filed on Jul. 26, 2018, now Pat. No. 10,964,789, which is a division of application No. 15/147,635, filed on May 5, 2016, now Pat. No. 10,121,867.

(60) Provisional application No. 62/273,473, filed on Dec. 31, 2015.

(51) Int. Cl.
*H10D 30/65* (2025.01)
*H10D 64/00* (2025.01)
*H10D 62/17* (2025.01)

(56) References Cited

U.S. PATENT DOCUMENTS

| | | | |
|---|---|---|---|
| 7,723,801 B2 | 5/2010 | Ahn | |
| 7,759,245 B2 | 7/2010 | Liu | |
| 8,507,378 B2 | 8/2013 | Liu | |
| 8,614,484 B2 | 12/2013 | Teo | |
| 9,231,097 B2 | 1/2016 | Lee | |
| 9,305,982 B2 | 4/2016 | Lv | |
| 9,349,818 B2 * | 5/2016 | Yu | H01L 29/66659 |
| 9,564,456 B2 | 2/2017 | Noumi | |
| 11,855,158 B2 * | 12/2023 | Wu | H10D 30/65 |
| 2004/0007742 A1 | 1/2004 | Cheng | |
| 2005/0048763 A1 | 3/2005 | Tzou | |
| 2008/0213965 A1 | 9/2008 | Yoon | |
| 2010/0052057 A1 | 3/2010 | Chung | |
| 2011/0156142 A1 | 6/2011 | Teo | |
| 2014/0231908 A1 | 8/2014 | Chen | |
| 2014/0362059 A1 | 12/2014 | Uemura | |
| 2015/0001637 A1 * | 1/2015 | Cheng | H10D 30/601 257/408 |
| 2016/0336410 A1 | 11/2016 | Hsiao | |

FOREIGN PATENT DOCUMENTS

| | | |
|---|---|---|
| KR | 20080074049 A | 8/2008 |
| TW | 201123424 A | 7/2011 |
| WO | 2015100801 A1 | 7/2015 |

\* cited by examiner

SEMICONDUCTOR STRUCTURE AND ASSOCIATED FABRICATING METHOD

PRIORITY CLAIM AND CROSS-REFERENCE

This application is a continuation application of U.S. patent application Ser. No. 17/301,219, filed Mar. 29, 2021, which is a continuation application of U.S. patent application Ser. No. 16/046,354, filed Jul. 26, 2018, now U.S. Pat. No. 10,964,789, which is a divisional application of U.S. patent application Ser. No. 15/147,635, filed May 5, 2016, now U.S. Patent no. 10,121,867, entitled "SEMICONDUCTOR STRUCTURE AND ASSOCIATED FABRICATING METHOD," which claims the benefit of U.S. provisional application no. 62/273,473, filed on Dec. 31, 2015, which are incorporated by reference in their entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. For example, as semiconductor circuits composed of devices such as metal-oxide-semiconductor field effect transistors (MOSFETs) are adapted for high voltage applications, problems arise with respect to incorporating a high voltage device with a low voltage device (e.g., a logic device) for system-on-chip (SoC) technology. Further, as the scaling down of logic devices continues with advanced technologies (e.g., 45 nm and below), the process flow may be accompanied with a high implantation concentration to prevent punch-through between a source and a drain or to reduce resistance of a source and a drain, and thus may cause greater leakage problems and the degradation of device reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
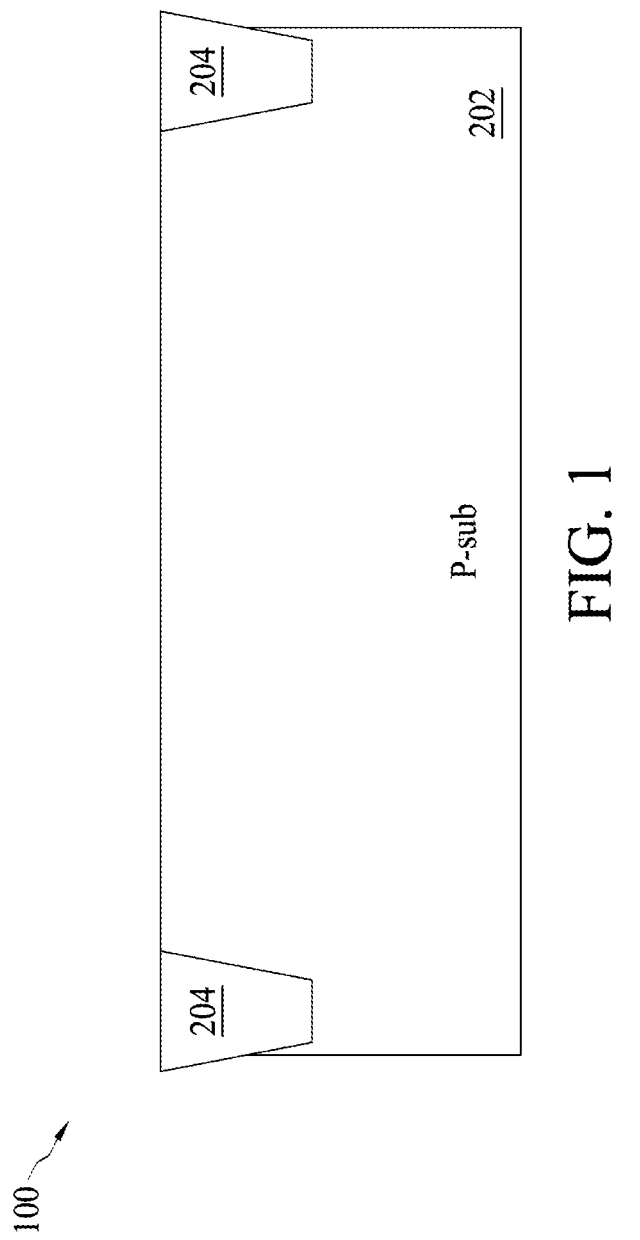
FIGS. 1-11 are diagrams illustrating a high voltage semiconductor device at various stages of fabrication according to an exemplary embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIGS. 1-11 are diagrams illustrating a high voltage semiconductor device 100 at various stages of fabrication according to an exemplary embodiment of the present disclosure. It is noted that FIGS. 1-11 have been simplified for a better understanding of the disclosed embodiment. Moreover, the high voltage semiconductor device 100 may be configured as a system-on-chip (SoC) device having various PMOS and NMOS transistors that are fabricated to operate at different voltage levels. The CMOS and NMOS transistors may provide low voltage functionality including logic/memory devices and input/output devices, and high voltage functionality including power management devices. For example, transistors that provide low voltage functionality may have operating (or drain) voltages of 1.1 V with standard CMOS technology, or voltages of 1.8/2.5/3.3 V with special (input/output) transistors in standard CMOS technology. In addition, transistors that provide medium/high voltage functionality may have operating (or drain) voltages of 5 V or greater (e.g., 20-35 V). It is understood that the high voltage semiconductor device 100 may also include resistors, capacitors, inductors, diodes, and other suitable microelectronic devices that are typically implemented in integrated circuits. In the present embodiment, the high voltage semiconductor device 100 includes an n-type high voltage MOS (NHVMOS) device.

Referring to FIG. 1, a semiconductor substrate 202 is provided. The substrate 202 may include a semiconductor wafer such as a silicon wafer. Alternatively, the substrate 202 may include other elementary semiconductors such as germanium. The substrate 202 may also include a compound semiconductor such as silicon carbide, gallium arsenic, indium arsenide, and indium phosphide. Moreover, the substrate 202 may include an alloy semiconductor such as silicon germanium, silicon germanium carbide, gallium arsenic phosphide, and gallium indium phosphide. In an embodiment, the substrate 202 includes an epitaxial layer (epi layer) overlying a bulk semiconductor. Furthermore, the substrate 202 may include a semiconductor-on-insulator (SOI) structure. For example, the substrate 202 may include a buried oxide (BOX) layer formed by a process such as separation by implanted oxygen (SIMOX). In various embodiments, the substrate 202 may include a buried layer such as an n-type buried layer (NBL), a p-type buried layer (PBL), and/or a buried dielectric layer including a buried oxide (BOX) layer. In the present embodiment, illustrated as an n-type HVMOS, the substrate 202 includes a p-type silicon substrate (p-substrate). To form a complementary HVMOS, an n-type buried layer, i.e., deep n-well (DNW), may be implanted deeply under the active region of the p-type HVMOS of the p-substrate 202.

Isolation feature structures 204 such as shallow trench isolations (STI) or local oxidation of silicon (LOCOS) including isolation features may be formed in the substrate 202 to define and electrically isolate various active regions. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

Figure 2:
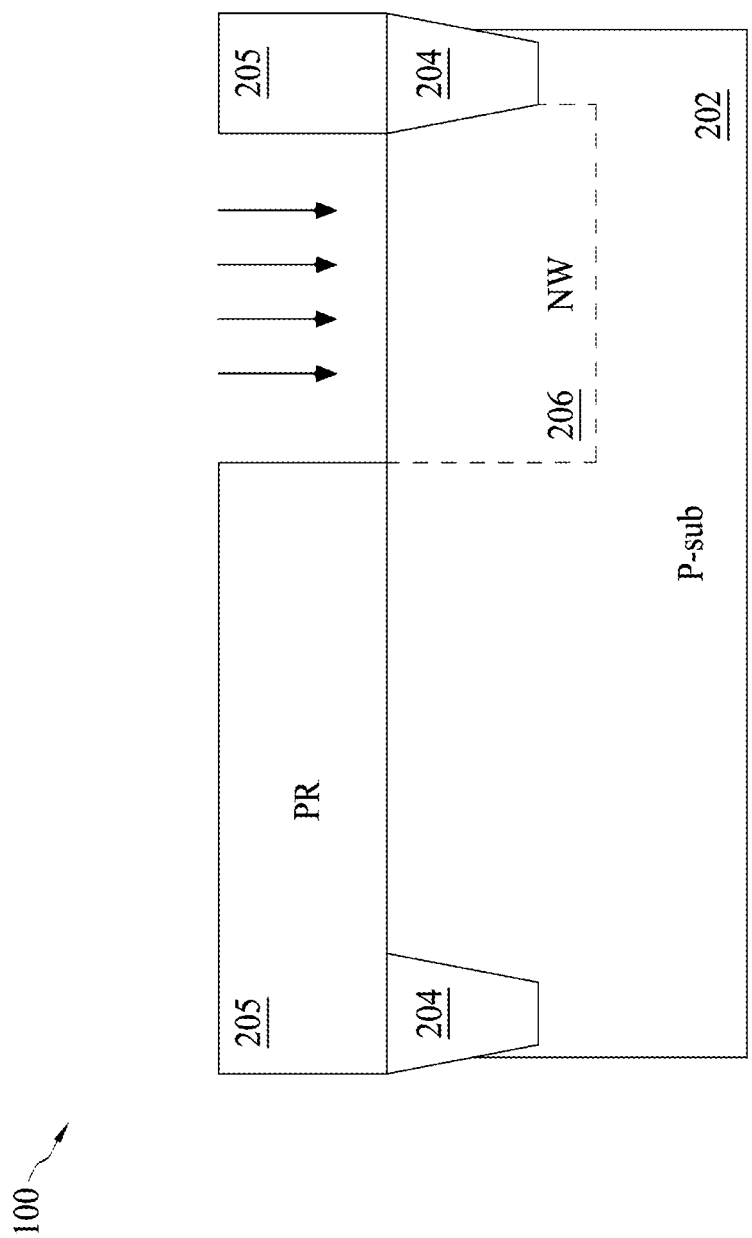

In FIG. 2, an N-well (NW) 206 is formed in various regions of the P-substrate 202 by ion-implantation or diffusion techniques known in the art. For example, an N-well mask is used to pattern a photoresist layer 205 in a photolithography process or other suitable process. An exemplary photolithography process may include processing steps of photoresist coating, soft baking, mask aligning, exposing, post-exposure baking, developing, and hard baking. An ion implantation utilizing an n-type dopant, such as arsenic or phosphorus, may be performed to form the N-well (NW) 206 in the substrate 202. The N-well 206 may be referred to as an extended drain of the NHVMOS device.

Figure 3:
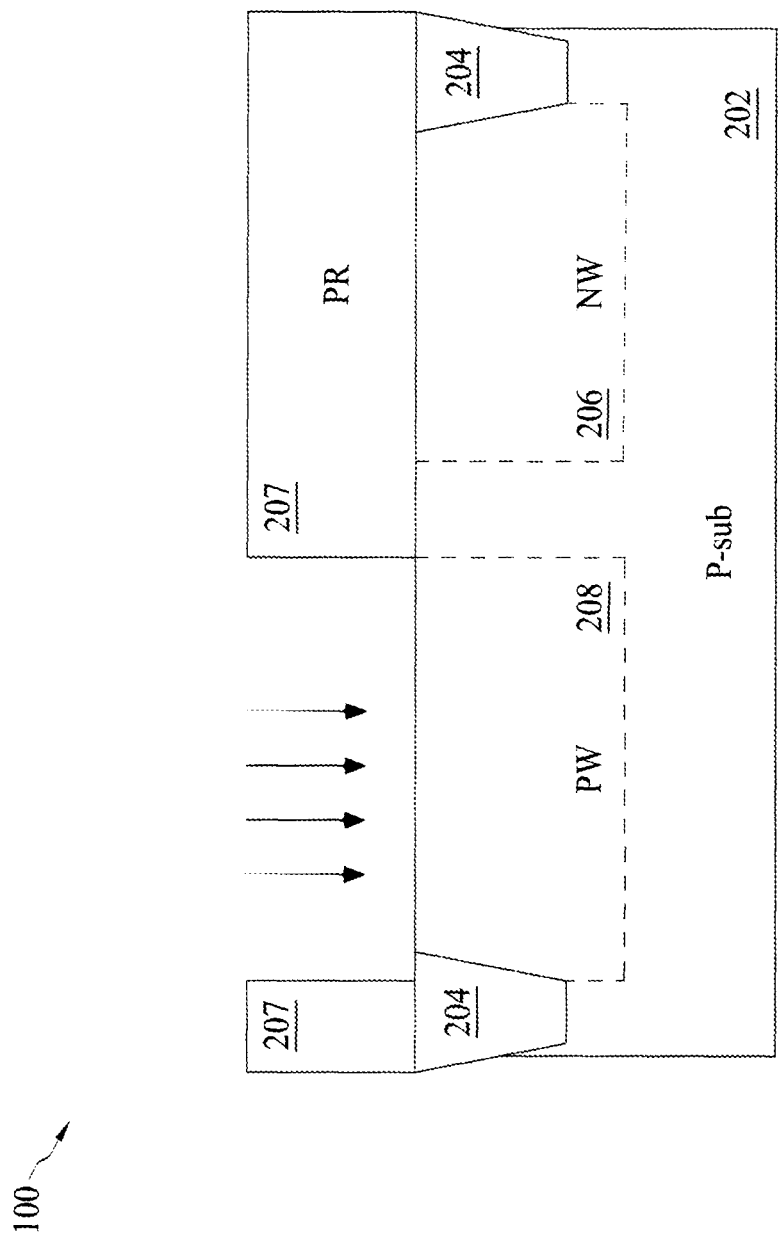

In FIG. 3, a P-well (PW) 208 is formed in various regions of the P-substrate 202 by ion-implantation or diffusion techniques known in the art. The P-well 208 may be formed in a similar manner as discussed above for the N-well 206. A P-well mask is used to pattern a photoresist layer 207 that protects the N-well 206. An ion implantation utilizing a p-type dopant, such as boron, may be performed to form the P-well 208 in the region where a source feature will be subsequently formed. It is noted that other ion implantation processes may also be performed to adjust threshold voltages of the core NMOS and CMOS devices in the other active regions of the substrate 202 as is known in the art.

Figure 4:
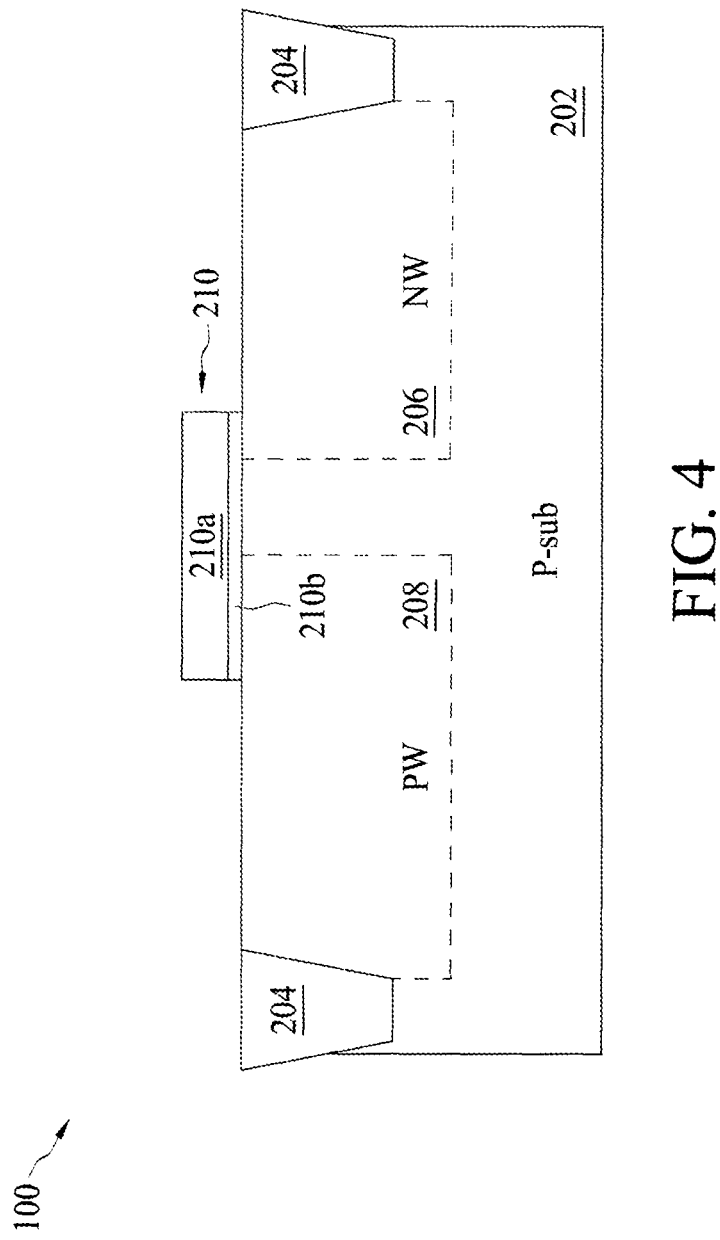

In FIG. 4, a gate structure 210 is formed on the semiconductor substrate 202. In this embodiment, the gate structure 210 includes a gate dielectric layer 210b formed on the substrate 202, and a gate electrode 210a formed on the gate dielectric layer 210b. Further, the gate structure 210 overlies a portion of the N-well 206 and a portion of the P-well 208. The gate dielectric layer 210b may include a silicon oxide layer. Alternatively, the gate dielectric layer 210b may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The gate dielectric layer 210b may have a multilayer structure such as one layer of silicon oxide and another layer of high k material. The gate dielectric layer 210b may be formed using chemical vapor deposition (CVD), physical vapor deposition (PVD), atomic layer deposition (ALD), thermal oxide, other suitable processes, or combinations thereof.

The gate electrode 210a may be configured to be coupled to metal interconnects and may be disposed overlying the gate dielectric layer 210b. The gate electrode 210a may include a doped polycrystalline silicon (or polysilicon). Alternatively, the gate electrode 210a may include a metal such as Al, Cu, W, Ti, Ta, TiN, TaN, NiSi, CoSi, other suitable conductive materials, or combinations thereof. The gate electrode 210a may be formed by CVD, PVD, plating, and other proper processes. The gate electrode 210a may have a multilayer structure and may be formed in a multi-step process using a combination of different processes.

The gate dielectric layer 210b and the gate electrode 210a formed on the substrate 202 are then patterned to form a plurality of gate structures using a process including photolithography patterning and etching. An exemplary method for patterning the gate dielectric layer 210b and the gate electrode 210a is described below. A layer of photoresist is formed on the polysilicon layer by a suitable process, such as spin-on coating, and then patterned to form a patterned photoresist feature by a proper lithography patterning method. The pattern of the photoresist can then be transferred by a dry etching process to the underlying polysilicon layer and the gate dielectric layer to form gate electrodes and gate dielectrics, in a plurality of processing steps and various proper sequences. The photoresist layer may be stripped thereafter. In another embodiment, only the gate electrode 210a is patterned. In still another embodiment, a hard mask layer may be used and formed on the polysilicon layer. The patterned photoresist layer is formed on the hard mask layer. The pattern of the photoresist layer is transferred to the hard mask layer and then transferred to the polysilicon layer to form the gate electrode 210a. The hard mask layer may include silicon nitride, silicon oxynitride, silicon carbide, and/or other suitable dielectric materials, and may be formed using a method such as CVD or PVD.

Figure 5:
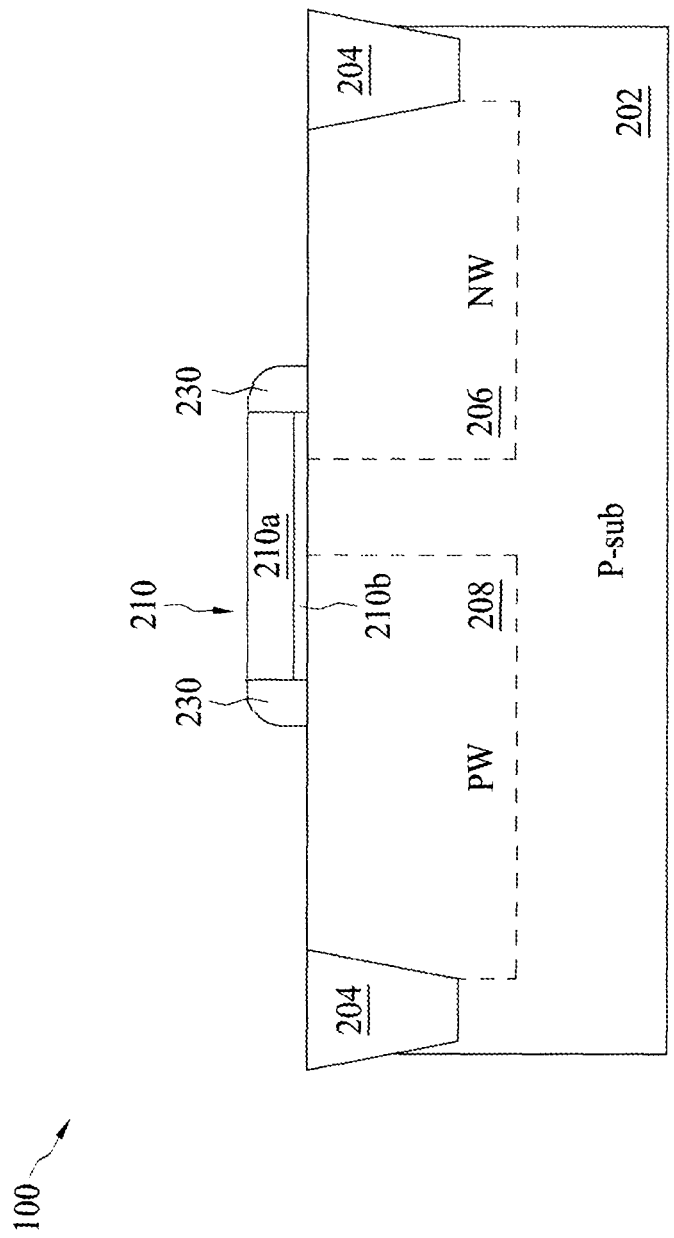

In FIG. 5, sidewall spacers 230 are formed on both sides of the gate structure 210. The sidewall spacers 230 may include a dielectric material such as silicon oxide. Alternatively, the sidewall spacers 230 may optionally include silicon nitride, silicon carbide, silicon oxynitride, or combinations thereof. In some embodiments, the sidewall spacers 230 may have a multilayer structure. The sidewall spacers 230 may be formed by a deposition and etching (anisotropic etching technique) as is known in the art.

Figure 6:
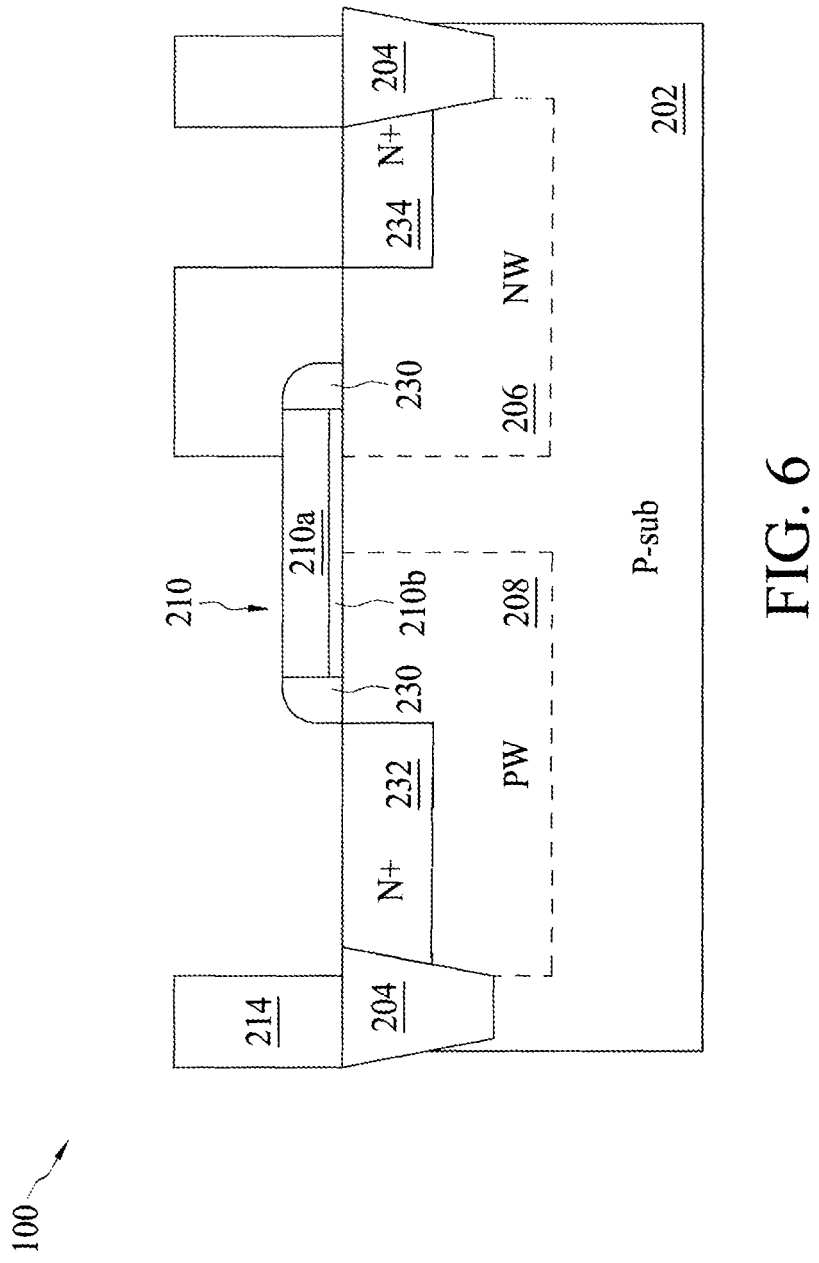

In FIG. 6, a source region 232 is formed in the P-well 208 and a drain region 234 is formed in the N-well 206, where the source region 232 and drain region 234 are n-type (referred to as N+ or heavily doped regions). The n-type source region 232 and the n-type drain region 234 may be positioned on both sides of the gate structure 210 and interposed thereby. In some embodiments, the source region 232 may include an edge substantially self-aligned to one of the sidewall spacers. In some embodiments, the drain region 234 may include an edge that is separated from the other one of the sidewall spacers. Accordingly, a patterned photoresist layer 214 may protect a portion of the semiconductor substrate 202 that extends beyond an outer edge of the other one of the sidewall spacers. In the present embodiment, the source region 232 and the drain region 234 include n-type dopants such as P or As. The source region 232 and the drain region 234 may be formed by a method such as ion implantation or diffusion. A rapid thermal annealing (RTA) process may be used to activate the implanted dopant. In various embodiments, the source region 232 and the drain region 234 may have different doping profiles formed by multi-process implantation. It should be noted that a process to form a source/drain of a p-type (referred to as P+ or heavily doped regions) may be performed for the PMOS devices in the other active regions of the substrate. Accordingly, the NMOS devices including the present embodiment may be protected by the patterned photoresist layer 214.

Figure 7:
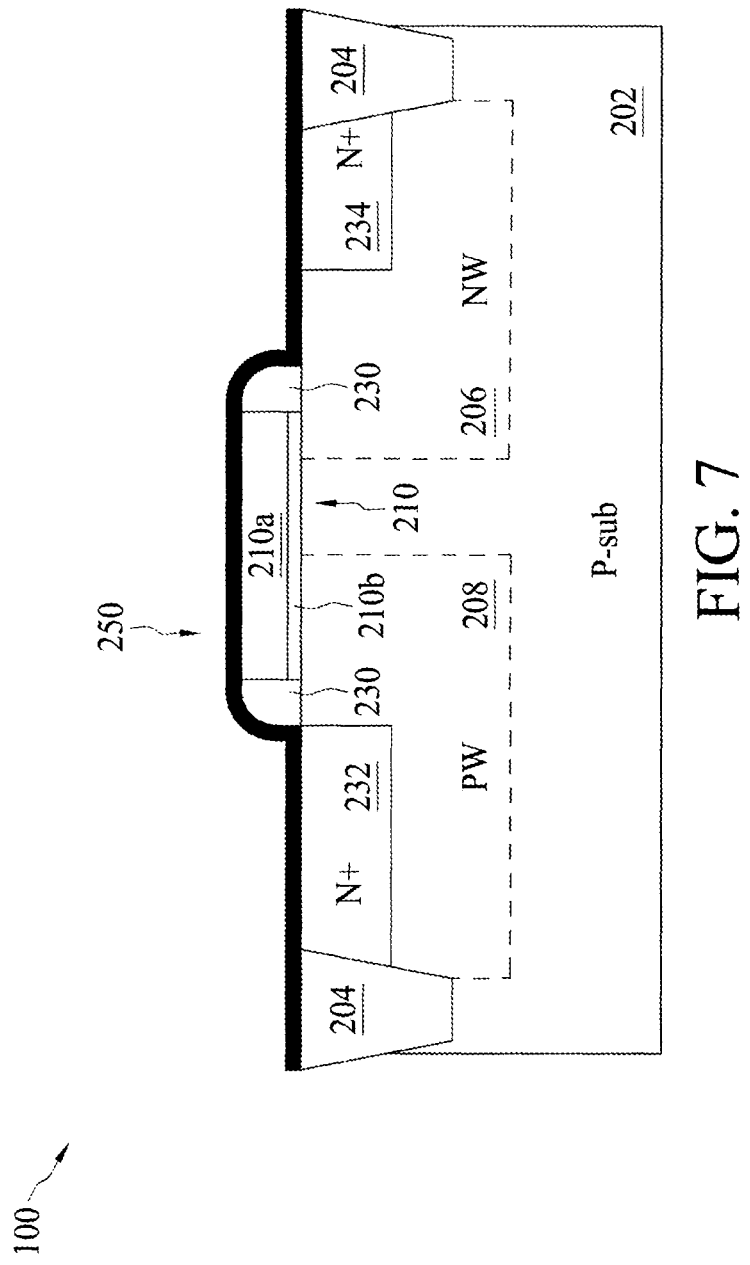
Figure 8:
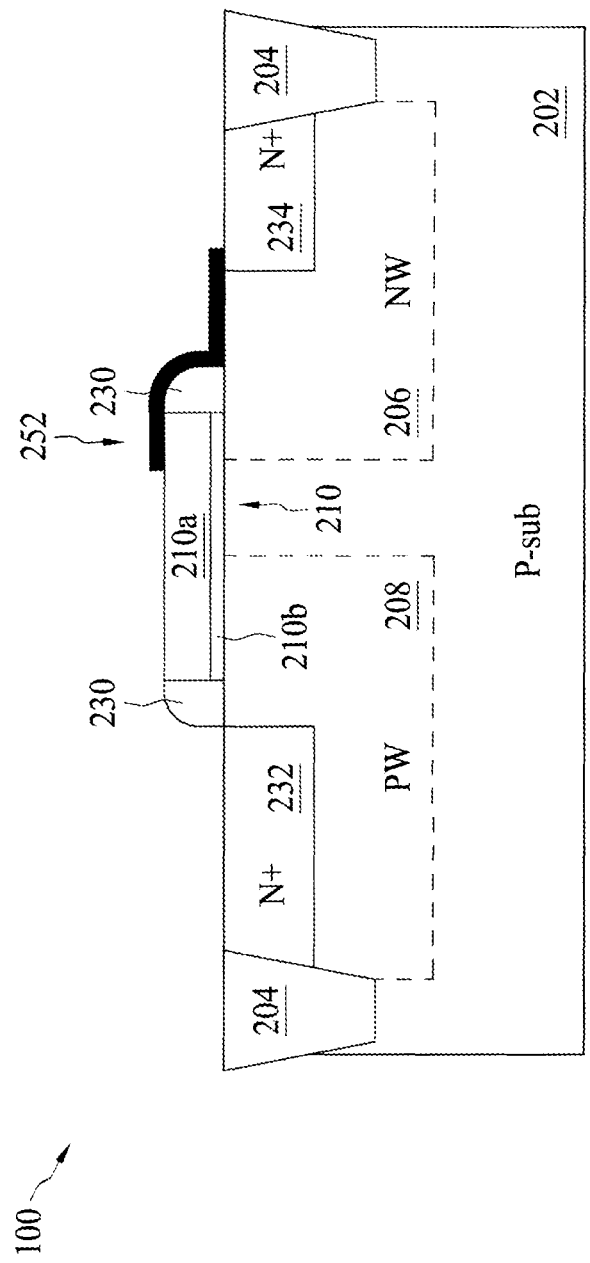

In FIG. 7, a resist protective oxide (RPO) layer 250 is formed over the gate structure 210, the sidewall spacers 230, the source region 232, the drain region 234 and the isolation feature structures 204. In one example, the RPO layer 250 is formed using silicon dioxide. In FIG. 8, the RPO layer 250 (shown in FIG. 7) is partially etched away, leaving the RPO layer 252 over at least a portion of the gate structure 210 and the sidewall spacers 230, extending over a portion of the drain region 234. The RPO layer 252 may function as a silicide blocking layer during a subsequent self-aligned silicide (silicide) process discussed below. The device area that does not use the silicide process is covered with the RPO layer 252. The RPO layer 252 can be defined by applying, for example, an oxide wet etch that partially removes the RPO layer 250. This protects the areas under the RPO layer 252 from the silicide formation.

Figure 9:
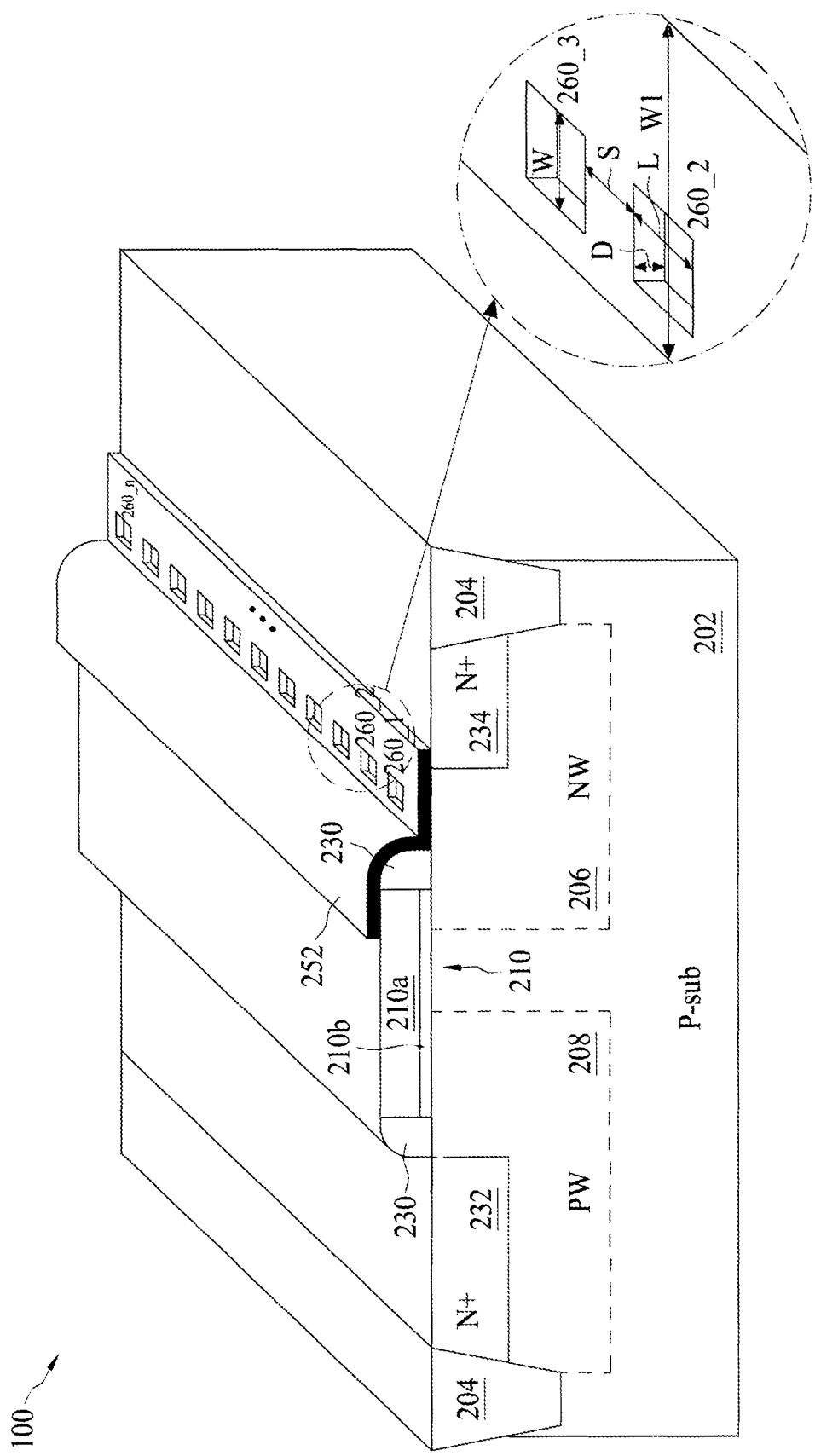

In FIG. 9, recesses 260_1-260_n are formed on the RPO layer 252. In particular, the recesses 260_1-260_n are formed on the RPO layer 252 above a portion between the sidewall spacers 230 and the drain region 234 by using a process including photolithography patterning and etching as is known in the art. One exemplary method for patterning the recesses 260_1-260_n is described below. A layer of photoresist is formed on the RPO layer 252 by a suitable process, such as spin-on coating, and then patterned to form a patterned photoresist feature by a proper lithography patterning method. In a plurality of processing steps and various proper sequences, the pattern of the photoresist can then be transferred by a dry and/or wet etching process to the underlying RPO layer 252 in order to form the recesses 260_1-260_n. The photoresist layer may be stripped thereafter. The process of photolithography patterning and etching may be combined with a standard HV process; thus, there is no additional mask required particularly for the formation of the recesses 260_1-260_n.

The number of the recesses 260_1-260_n is not limited, and in some embodiments, n is equal to or greater than 1. In this embodiment, a length L of each of the recesses 260_1-260_n is equal to a width W of each of the recesses 260_1-260_n. As can be seen from the enlarged portion of the recesses 260_2 and 260_3, the length L of each of the recesses 260_1-260_n is about 0.16 um, and the width W of each of the recesses 260_1-260_n is about 0.16 um. However, this is not a limitation of the present disclosure. In some embodiments, the length L of each of the recesses 260_1-260_n may not be equal to the width W of each of the recesses 260_1-260_n. For example, an elongated rectangular recess may be formed along the length of the surface of the RPO layer 252 above the portion between the sidewall spacers 230 and the drain region 234 to replace the recesses 260_1-260)_n. In some embodiments, each of the recesses 260_1-260_n may have a distinct dimension. In some embodiments, a ratio of the width W of each of the recesses 260_1-260_n to a width W1 of the extending portion of the RPO layer 252 horizontally laying on the substrate 202 may range from about 0.2 to about 0.3. In some embodiments, a ratio of the width W of each of the recesses 260_1-260_n to a width W1 of the extending portion horizontally laying on the substrate 202 may range from about 0.1 to about 0.5. However, this is not a limitation of the present disclosure.

In this embodiment, a spacing S between any two neighboring recesses of the recesses 260_1-260_n may be about 0.16 um. However, this is not a limitation of the present disclosure. In some embodiments, the spacing S between any two neighboring recesses of the recesses 260_1-260_n may range from about 0.16 um to about 0.19 um. In other embodiments, the spacing S between any two neighboring recesses of the recesses 260_1-260_n may be less than about 0.16 um or greater than about 0.19 um. In other words, a ratio of the spacing S to the width W of the recesses may range from about 1 to about 1.2. In this embodiment, a depth D of each of the recesses 260_1-260_n may be about 0 angstrom to about 650 angstroms. In other words, a ratio of the depth D of each of the recesses 260_1-260_n to a thickness of the extending portion of the RPO layer 252 may range from about 0 to about 0.8. However, this is not a limitation of the present disclosure. Please note that in some embodiments, the recesses 260_1-260_n may not exist when the depth D equals to about 0. In addition, the depth D of each of the recesses 260_1-260_n is limited to not equaling the depth of the extending portion of the RPO layer 252. In other words, the recesses 260_1-260_n are configured to extend toward the underneath of the N-well 206 and stop extending before penetrating the RPO layer 252.

Figure 10:
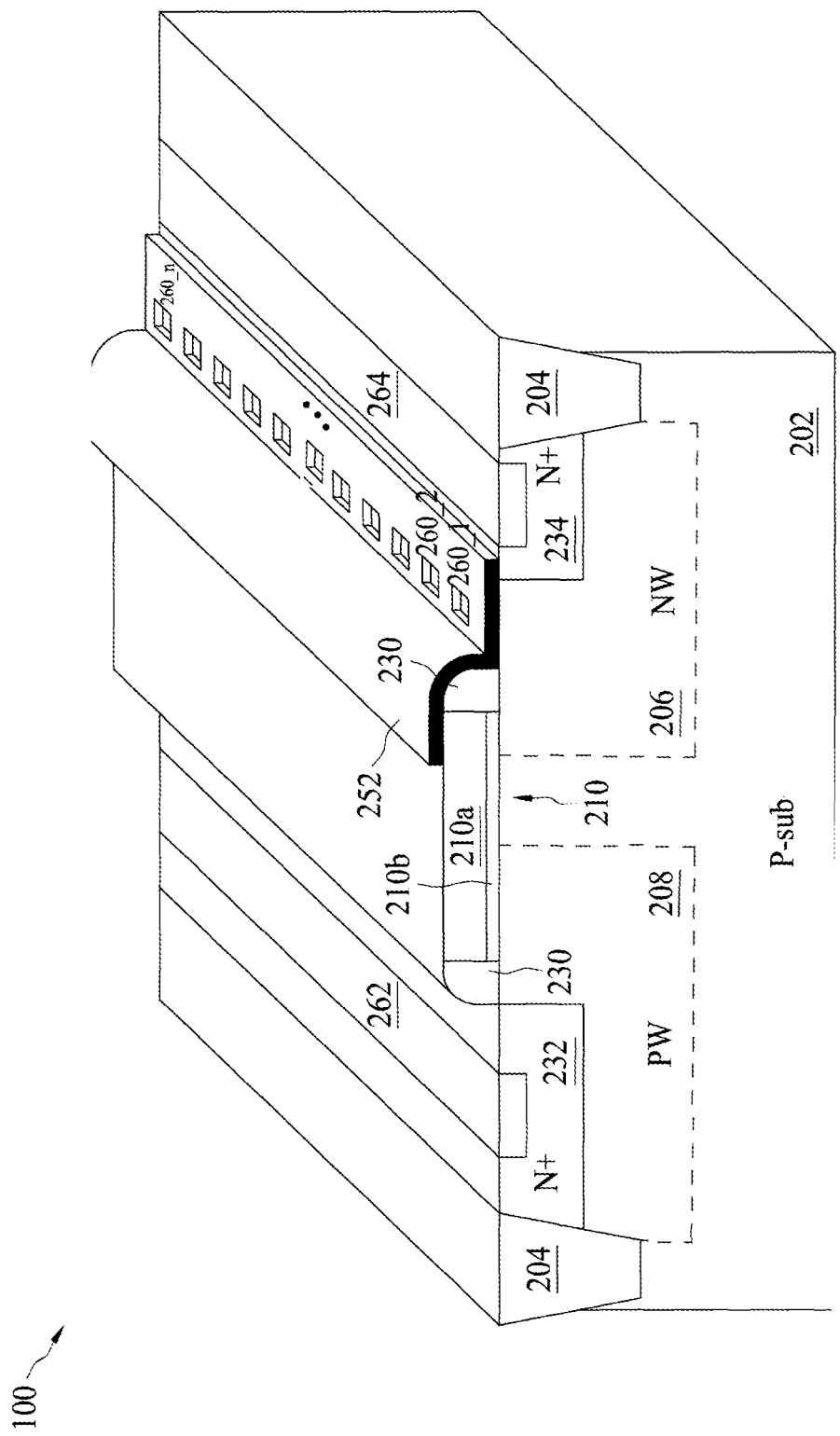

It is understood that the semiconductor device 100 may undergo further CMOS processing as is known in the art. For example, the semiconductor device 100 may further include forming various contacts and metal features on the substrate 202. Silicide features may be formed by silicidation, such as salicide, in which a metal material is formed next to an Si structure, then the temperature is raised to anneal and cause a reaction between underlying silicon and the metal so as to form silicide, and the un-reacted metal is etched away. The salicide material may be self-aligned to be formed on various features such as the source region 232, the drain region 234 and/or the gate electrode 210a to reduce contact resistance. In this embodiment, a source salicide region 262 is formed in the source region 232, and a drain salicide region 264 is formed in the drain region 234 as shown in FIG. 10.

Also, a plurality of patterned dielectric layers and conductive layers are formed on the substrate 202 in order to form multilayer interconnects configured to couple the various p-type and n-type doped regions in the substrate 202, such as the source region 232, the drain region 234, and the gate electrode 210a. In an embodiment, an interlayer dielectric (ILD) layer 266 and a multilayer interconnect (MLI) structure 268 are formed in a configuration such that the ILD layer 266 separates and isolates each metal layer from other metal layers. In furtherance of the example, the MLI structure 268 includes contacts, vias and metal lines formed on the substrate 202. In one example, the MLI structure 268 may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connections (vias and contacts) and horizontal connections (conductive lines). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The ILD layer 266 includes silicon oxide. Alternatively or additionally, the ILI) layer 266 includes a material having a low dielectric constant such as a dielectric constant less than about 3.5. In an embodiment, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on coating, CVD, or other suitable processes.

Figure 11:
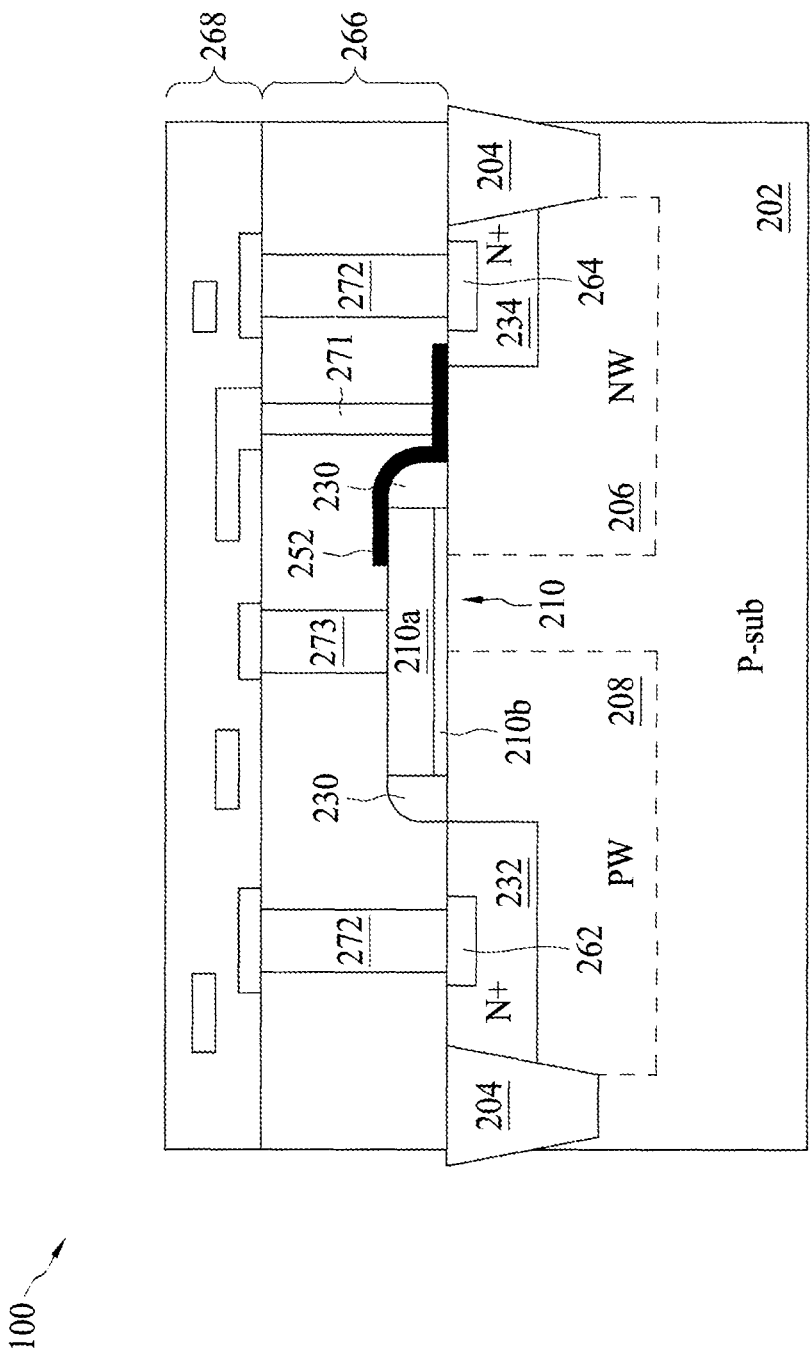

The MLI structure 268 and the ILD layer 266 may be formed in an integrated process, such as a damascene process. In a damascene process, a metal such as copper is used as conductive material for interconnection. Another metal or metal alloy may be additionally or alternatively used for various conductive features. Accordingly, silicon oxide, fluorinated silica glass, or low dielectric constant (k) materials can be used for the ILD layer 266. During the damascene process, a trench is formed in a dielectric layer, and copper is filled in the trench. As shown in FIG. 11, a trench 272 filled with metal, such as copper, is formed in the ILD layer 266 to interconnect the source salicide region 262 of the source region 232 to the upper MLI structure 268; a trench 274 filled with metal, such as copper, is formed in the ILD layer 266 to interconnect the drain salicide region 264 of the drain region 234 to the upper MLI structure 268; a trench 273 filled with metal, such as copper, is formed in the ILD layer 266 to interconnect the gate electrode 210a to the upper MLI structure 268; and a trench 271 filled with metal, such as copper, is formed in the ILD layer 266 to interconnect the RPO layer 252 to the upper MLI structure 268. The trench 271 may be formed on one of the recesses 260_1-260_n, and the metal filled in the trench 271 may substantially fill the one of the recesses 260_1-260_n. In some embodiments, the trench 271 may be formed on at least one of the recesses 260_1-260_n. For example, the trench 271 may be formed on the recesses 260_1-260_n and the metal filled in the trench 271 may substantially fill the recesses 260_1-260_n. As is known in the art, a chemical mechanical polishing (CMP) technique may be implemented afterward to etch back and planarize the substrate surface.

The trench 271 is coupled to the source region 232 through the MLI structure 268 and the trench 272. As such, the trench 271 is equipotential to the source region 232 during operation. The high voltage electric field induced by the high voltage at the drain region 234 is therefore shielded by the metal filled in the trench 271. In this way, the trench 271 can be regarded as a voltage electric field barrier, and at least the region at the side opposite to the drain region 234 and above the bottom of the trench 271 can be approximately equipotential to the source region 232. The voltage breakdown at the gate structure 210 can be consequently mitigated. In addition, the metal in the trench 271 filling the recesses 260_1-260_n can be helpful to elongate the metal barrier in order to protect the interface between the gate structure 210 and the substrate 202. Moreover, a capacitance $C_{GD}$ between the gate structure 210 and the drain region 234 can also be reduced, thereby increasing the operating bandwidth.

Among various embodiments, the present method and structure provide an enhanced performance high voltage device. By implementing the trench 271 filled with metal extending to the RPO layer between the drain region and the gate structure, the breakdown voltage and the operating bandwidth can be significantly reduced without sacrificing the conductive resistance. Compared to an existing structure having an STI feature intentionally disposed in a substrate between a drain region and a gate structure, the conductive resistance of the present disclosure can be improved since the STI feature that blocks current flow is removed. Moreover, the high voltage device and method of making the same disclosed herein may be fabricated with the same process that is used to form NMOS and PMOS devices (CMOS process flow) for a logic device (low voltage) without requiring additional photomask and/or other processes. Therefore, the cost for fabricating SoC that includes both high voltage and logic devices is kept low.

The disclosed structure and method may have various embodiments, modifications and variations. The high voltage device may not be limited to an n-type MOS device and can be extended to a p-type MOS device with a similar structure and configuration, except that all doping types may be reversed and with a DNW buried substrate. The corresponding dimensions are modified according to the design for the desired transistor performance. Further embodiments may also include, but are not limited to, vertical diffused metal-oxide-semiconductor (VDMOS), other types of high power MOS transistors, Fin structure field effect transistors (FinFET), and strained MOS structures.

Some embodiments of the present disclosure provide a semiconductor structure. The semiconductor structure includes: a substrate; a gate structure formed on the substrate; a source region and a drain region formed in the substrate on either side of the gate structure, the source region and the drain region both having a first type of conductivity; and a resist protective oxide (RPO) layer having a first portion and a second portion, wherein the first portion of the RPO layer is formed on a portion of the gate structure, and the second portion of the RPO layer is horizontally formed on the substrate and extending to a portion of the drain region, wherein the RPO layer includes at least one recess on the second portion.

Some embodiments of the present disclosure provide a semiconductor structure. The semiconductor structure includes: a substrate; a gate structure formed on the substrate; a source region and a drain region formed in the substrate on either side of the gate structure, the source region and the drain region both having a first type of conductivity; a resist protective oxide (RPO) layer having a first portion and a second portion, wherein the first portion of the RPO layer is formed on a portion of the gate structure, and the second portion of the RPO layer is horizontally formed on the substrate and extending to a portion of the drain region, wherein the RPO layer includes at least one recess on the second portion; and an interlayer dielectric (ILD) layer formed on the substrate, the IDL layer including a through trench to the at least one recess, wherein the through trench is substantially filled by conductive material.

Some embodiments of the present disclosure provide a method for fabricating a semiconductor structure. The method includes: providing a substrate; forming a gate structure on the substrate; forming a source region and a drain region in the substrate on either side of the gate structure, the source region and the drain region both having a first type of conductivity; forming a resist protective oxide (RPO) layer over the substrate, wherein the RPO layer has a first portion and a second portion, the first portion is formed on a portion of the gate structure, and the second portion is horizontally formed on the substrate and extending to a portion of the drain region; and forming at least one recess on the second portion of the RPO layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate having at least one doped region;
a gate structure formed over the substrate having at least one doped region;
a first source/drain region having a first type of conductivity and a second source/drain region having the first type of conductivity formed, the gate structure disposed over an area between the first source/drain region and the second source/drain region;
a dielectric layer contiguously extending from over the gate structure to interfacing a top surface of the substrate, wherein the dielectric layer includes a recess; and
a first trench extending to the recess, a second trench extending to the second source/drain region, and a third trench extending to the first source/drain region, wherein the first, second and third trenches are filled with conductive material.

2. The semiconductor structure of claim 1, further comprising:
a spacer element on sidewalls of the gate structure, wherein the dielectric layer is formed on the spacer element.

3. The semiconductor structure of claim 1, wherein the gate structure includes a gate dielectric layer, the gate dielectric layer interfacing the top surface of the substrate.

4. The semiconductor structure of claim 1 wherein the recess has a bottom exposing the top surface of the substrate between the second source/drain region and the gate structure.

5. The semiconductor structure of claim 1, wherein the second trench extends to a salicide region of the second source/drain region.

6. The semiconductor structure of claim 1, wherein the dielectric layer is silicon oxide.

7. The semiconductor structure of claim 1, wherein the dielectric layer has a first terminal end over the gate structure and a second terminal end over the second source/drain region.

8. A semiconductor structure, comprising:
a gate structure formed on a substrate, wherein the gate structure extends in a first direction;
a first source/drain region disposed on a first side of the gate structure and a second source/drain region formed on a second side of the gate structure, the first and second source/drain regions having a first type of conductivity;
a first metal filled trench extending to the first source/drain region;
a second metal filled trench extending to the second source/drain region; and
a plurality of metal filled recesses, wherein each recess of the plurality of metal filled recesses is arranged in a line parallel to the first direction and wherein each recess of the plurality of metal filled recesses provides metal interfacing a top surface of the substrate.

9. The semiconductor structure of claim 8, wherein each recess of the plurality of metal filled recesses provides metal interfacing the top surface of the substrate that is a doped well region.

10. The semiconductor structure of claim 8, wherein a region of the top surface of the substrate interfacing the plurality of metal filled recesses is disposed between a doped region of the second source/drain region and a region directly under the gate structure.

11. The semiconductor structure of claim 10, wherein the doped region is an N+ doped region.

12. The semiconductor structure of claim 11, wherein a terminal edge of a dielectric layer including the plurality of metal filled recesses is disposed over the N+ doped region.

13. A semiconductor structure, comprising:
a substrate;
a gate structure over the substrate;
a first region and a second region in the substrate on either side of the gate structure, the first region and the second region both having a first type of conductivity;
a dielectric layer over the substrate, wherein the dielectric layer has a first portion and a second portion, the first portion is formed on a portion of the gate structure, and the second portion is formed on the substrate and extending to a portion of the second region; and
a vertically extending recess in the second portion of the dielectric layer, wherein the vertically extending recess extends vertically entirely through the dielectric layer between the second region and the gate structure in a cross-sectional view, the vertically extending recess spaced a first distance from the second region and a second distance from the gate structure.

14. The semiconductor structure of claim 13, further comprising:
another vertically extending recess in the second portion of the dielectric layer, wherein the another vertically extending recess extends vertically entirely through the dielectric layer between the second region and the gate structure in a second cross-sectional view parallel to the cross-sectional view.

15. The semiconductor structure of claim 13, further comprising:
   an interlayer dielectric (ILD) over the dielectric layer, the gate structure, the first region and the second region.

16. The semiconductor structure of claim 15, further comprising:
   a first trench in the ILD extending to the first region;
   a second trench in the ILD extending to the second region; and
   a third trench in the ILD extending to the vertically extending recess.

17. The semiconductor structure of claim 16, further comprising:
   conductive material filling the first trench, the second trench and the third trench with conductive material.

18. The semiconductor structure of claim 16, further comprising:
   forming a fourth trench in the ILD extending to the gate structure.

19. The semiconductor structure of claim 13, wherein conductive material fills the vertically extending recess.

20. The semiconductor structure of claim 13, wherein the substrate further includes a silicide region on the first region and a silicide region on the second region.

* * * * *